US011871524B2

(12) United States Patent
Okamoto

(10) Patent No.: US 11,871,524 B2
(45) Date of Patent: Jan. 9, 2024

(54) COMPONENT-INCORPORATED SUBSTRATE AND METHOD FOR MANUFACTURING SAME

(71) Applicant: FUJIKURA LTD., Tokyo (JP)

(72) Inventor: Masahiro Okamoto, Tokyo (JP)

(73) Assignee: Fujikura Ltd., Tokyo (JP)

( * ) Notice: Subject to any disclaimer, the term of this patent is extended or adjusted under 35 U.S.C. 154(b) by 1217 days.

(21) Appl. No.: 16/328,646

(22) PCT Filed: Aug. 21, 2017

(86) PCT No.: PCT/JP2017/029782
§ 371 (c)(1),
(2) Date: Feb. 26, 2019

(87) PCT Pub. No.: WO2018/147612
PCT Pub. Date: Mar. 15, 2018

(65) Prior Publication Data
US 2021/0204414 A1 Jul. 1, 2021

(30) Foreign Application Priority Data

Sep. 9, 2016 (JP) .................................. 2016-176131
Jul. 14, 2017 (JP) .................................. 2017-138535

(51) Int. Cl.
*H05K 1/03* (2006.01)
*H05K 1/11* (2006.01)
(Continued)

(52) U.S. Cl.
CPC ............... *H05K 3/46* (2013.01); *H01L 23/12* (2013.01); *H05K 1/00* (2013.01); *H05K 1/03* (2013.01);
(Continued)

(58) Field of Classification Search
CPC .. H05K 3/46; H05K 1/00; H05K 1/03; H05K 3/0008; H05K 3/103; H05K 1/0251;
(Continued)

(56) References Cited

U.S. PATENT DOCUMENTS

2008/0130254 A1\* 6/2008 Han ....................... H05K 1/183
29/762
2009/0321122 A1\* 12/2009 Mori ................... H01R 13/6586
29/852

(Continued)

FOREIGN PATENT DOCUMENTS

| JP | 2013-55109 A | 3/2013 |
| JP | 2013-211480 A | 10/2013 |
| JP | 2014-049558 A | 3/2014 |

OTHER PUBLICATIONS

International Search Report issued in corresponding International Patent Application No. PCT/JP2017/029782 dated Nov. 7, 2017 (1 page).

(Continued)

*Primary Examiner* — Ishwarbhai B Patel
(74) *Attorney, Agent, or Firm* — Osha Bergman Watanabe & Burton LLP

(57) ABSTRACT

A component-incorporated substrate of multi-layer structure includes: a plurality of printed wiring base members that are batch-laminated via an adhesive layer, with the plurality of printed wiring base members including a resin base member that includes a wiring pattern on at least one surface thereof and a via connected to the wiring pattern; an opening disposed in at least one printed wiring base member that is sandwiched on both sides by other printed wiring base members of the plurality of printed wiring base members; and an electronic component disposed in the opening. At least part of the wiring pattern of the printed wiring base member where the opening is formed is disposed in a frame shape surrounding the opening, in a periphery of the opening.

4 Claims, 11 Drawing Sheets

(51) Int. Cl.
H05K 1/18 (2006.01)
H05K 3/46 (2006.01)
H05K 3/00 (2006.01)
H05K 3/10 (2006.01)
H05K 1/00 (2006.01)
H01L 23/12 (2006.01)
H05K 1/02 (2006.01)
H01L 23/498 (2006.01)

(52) U.S. Cl.
CPC ............ *H05K 1/112* (2013.01); *H05K 1/183* (2013.01); *H05K 3/0008* (2013.01); *H05K 3/103* (2013.01); *H01L 23/49822* (2013.01); *H01L 23/49827* (2013.01); *H05K 1/0251* (2013.01)

(58) Field of Classification Search
CPC ........... H05K 3/4697; H05K 2203/063; H05K 3/4617; H05K 2201/09727; H01L 23/12; H01L 23/49822; H01L 23/49827; H01L 23/145; H01L 21/486; H01L 23/49833; H01L 23/5389
See application file for complete search history.

(56) References Cited

U.S. PATENT DOCUMENTS

| 2011/0240354 | A1* | 10/2011 | Furuhata | ................ H01L 24/20 29/830 |
| 2015/0103499 | A1* | 4/2015 | Gouchi | ................ H05K 1/0293 361/746 |
| 2015/0359103 | A1* | 12/2015 | Sano | ...................... H05K 1/185 216/13 |

OTHER PUBLICATIONS

English translation of Office Action issued in corresponding Japanese Patent Application No. 2018-538340, dated Sep. 24, 2019 (4 pages).
International Preliminary Report on Patentability issued in corresponding International Application No. PCT/JP2017/029782, dated Mar. 12, 2019 (6 pages).

* cited by examiner

A-A' Cross Section

FIG. 12
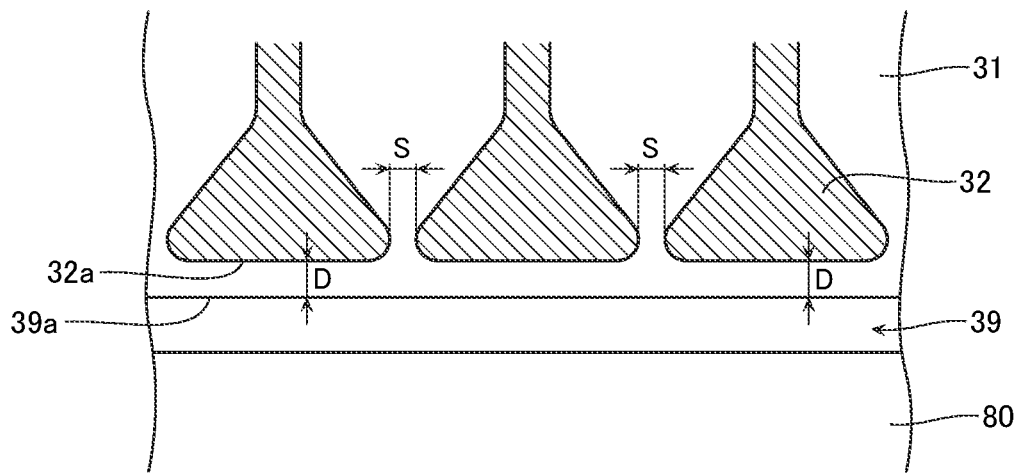
FIG. 13
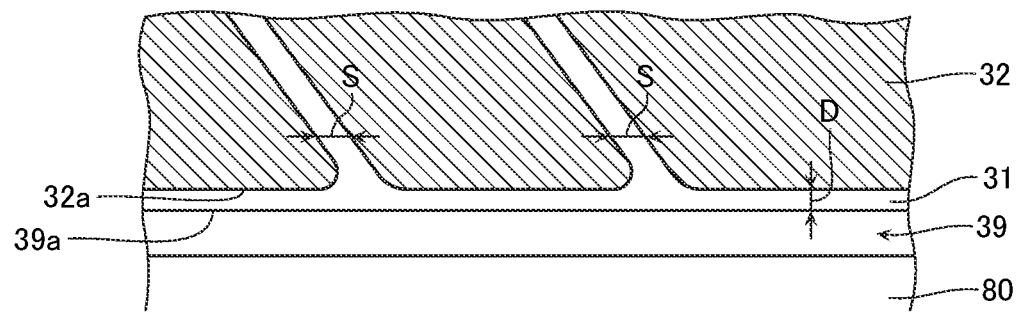
FIG. 14
|   | Defect Mode |
|---|---|
| 0 | No Defect |
| 1 | Inter-Component/Pattern Insulation Defect |
| 2 | Adhesive Material Filling Defect |
| 3 | Substrate Surface Flatness Defect |

| Adhesive Material | | A | | | B | | |
|---|---|---|---|---|---|---|---|
| Component Thickness : mm | | 0.05 | 0.1 | 0.15 | 0.05 | 0.1 | 0.15 |
| D mm | 0 | 1 | 1 | 1 | 1 | 1 | 1 |
| | 0.001 | 0 | 0 | 1 | 0 | 0 | 0 |
| | 0.002 | 0 | 0 | 0 | 0 | 0 | 0 |
| | 0.005 | 0 | 0 | 0 | 0 | 0 | 0 |
| | 0.01 | 0 | 0 | 0 | 0 | 0 | 0 |
| | 0.02 | 0 | 0 | 0 | 0 | 0 | 0 |
| | 0.05 | 0 | 0 | 0 | 0 | 0 | 0 |
| | 0.1 | 0 | 0 | 2 | 0 | 0 | 0 |
| | 0.15 | 0 | 2 | 2,3 | 0 | 0 | 3 |
| | 0.2 | 0 | 2 | 2,3 | 0 | 3 | 3 |

| Adhesive Material | A | |
|---|---|---|
| Component Thickness : mm | 0.1 | 0.15 |
| S mm  0.05 | 0 | 0 |
| 0.1 | 0 | 0 |
| 0.2 | 0 | 0 |
| 0.3 | 0 | 3 |
| 0.5 | 0 | 3 |

M-M' Cross Section

COMPONENT-INCORPORATED SUBSTRATE AND METHOD FOR MANUFACTURING SAME

TECHNICAL FIELD

The present invention relates to a component-incorporated substrate of multi-layer structure having an electronic component incorporated therein, and to a method of manufacturing the same.

BACKGROUND

In order to promote high-density mounting of electronic components in compact precision electronic appliances of recent years, further improvement of component-incorporated substrate technology by which electronic components are incorporated within printed substrates, is being required. The component-incorporated substrate disclosed in Patent Document 1 mentioned below is known as a component-incorporated substrate employing component-incorporated substrate technology. In this component-incorporated substrate, as shown in, for example, FIG. 20A, an opening 110 provided for housing an electronic component 90 on an inside of the component-incorporated substrate is formed in an inner side region of a frame-like section 111 being part of a conductive layer 112 provided in a resin layer 113. That is, by being formed by laser light, or the like, in the opening 110 using as a mask the frame-like section 111 formed simultaneously with a wiring pattern, the opening 110 can be accurately positioned with respect to the wiring pattern.

Therefore, since there is no need for a size of the opening 110 to be made to a size that takes account of a shift in formation position that could cause trouble in housing of the electronic component 90, it has been regarded as capable of achieving downsizing of a component-incorporated substrate 100. Moreover, there is an advantage that since the frame-like section 111 is formed so as to surround the opening 110, the frame-like section 111 functions so that, at a time of batch-lamination by thermo-compression bonding of a multi-layer substrate, an adhesive material entering a gap between the opening 110 and the electronic component 90 is further pushed in, and flatness of a substrate surface in a periphery of the opening 110 can be well secured.

PATENT DOCUMENT

Patent Document 1: Japanese Patent Laid-Open No. 2013-55109

However, although in the component-incorporated substrate 100 disclosed in Patent Document 1 mentioned above, forming the frame-like section 111 is effective from a viewpoint of securing flatness of the substrate in the opening 110 periphery, particularly securing flatness of the substrate surface, as shown in FIG. 20B, a space for forming the frame-like section 111 is required between the opening 110 and the conductive layer 112, hence further downsizing of the substrate overall is difficult to achieve.

SUMMARY

Embodiments of the present invention provide a component-incorporated substrate that can achieve downsizing of the substrate overall while securing flatness of the substrate in a periphery of an opening housing an electronic component, and a method of manufacturing the component-incorporated substrate.

A component-incorporated substrate according to one or more embodiments of the present invention is a component-incorporated substrate of multi-layer structure in which a plurality of printed wiring base members are batch-laminated via an adhesive layer, the printed wiring base members including a resin base member that has a wiring pattern formed on at least one surface thereof and that has formed therein a via connected to the wiring pattern, at least one printed wiring base member that is sandwiched on both sides by other printed wiring base members, of the plurality of printed wiring base members having formed therein an opening, an electronic component being incorporated in the opening, the component-incorporated substrate, wherein at least part of the wiring pattern of the printed wiring base member where the opening is formed is disposed in a frame shape surrounding the opening, in a periphery of the opening.

The printed wiring base member where the opening is formed preferably has formed therein a plurality of the wiring patterns, and, preferably, at least part of the plurality of wiring patterns is intensively disposed in the frame shape.

A spacing between adjacent portions where the plurality of wiring patterns have been intensively disposed in the frame shape is preferably not less than 50 μm and not more than 200 μm.

The wiring pattern is preferably disposed in a position further withdrawn or recessed in a horizontal direction than an opening end of the opening is.

In addition, a distance from an opening end of the opening to an end section on an opening side of the wiring pattern is preferably not less than 2 μm and not more than 100 μm.

Another component-incorporated substrate according to one or more embodiments of the present invention is a component-incorporated substrate of multi-layer structure in which a plurality of printed wiring base members are batch-laminated via an adhesive layer, the printed wiring base members including a resin base member that has a wiring pattern formed on at least one surface thereof and that has formed therein a via connected to the wiring pattern, at least one printed wiring base member that is sandwiched on both sides by other printed wiring base members, of the plurality of printed wiring base members having formed therein an opening, an electronic component being incorporated in the opening, the component-incorporated substrate, wherein at least part of the wiring pattern of the printed wiring base member where the opening is formed includes a first portion by which connection is made via the via and a second portion extending from the first portion toward an opening end of the opening, and is formed in a pattern that the second portion is disposed in a frame shape so as to surround the opening.

The printed wiring base member where the opening is formed preferably has formed therein a plurality of the wiring patterns, and, preferably, at least part of the plurality of wiring patterns each includes the first and second portions, and is formed in a pattern that the second portion is intensively disposed in the frame shape.

A spacing between adjacent second portions is preferably not less than 50 μm and not more than 200 μm.

The wiring pattern is preferably formed in a pattern that the second portion is disposed in a position further withdrawn or recessed in a horizontal direction than an opening end of the opening is.

In addition, a distance from an opening end of the opening to an end section on an opening side of the second portion is preferably not less than 2 μm and not more than 100 μm.

A method of manufacturing a component-incorporated substrate according to one or more embodiments of the present invention is a method of manufacturing a component-incorporated substrate of multi-layer structure in which a plurality of printed wiring base members are batch-laminated via an adhesive layer, the printed wiring base members including a resin base member that has a wiring pattern formed on at least one surface thereof and that has formed therein a via connected to the wiring pattern, at least one printed wiring base member that is sandwiched on both sides by other printed wiring base members, of the plurality of printed wiring base members having formed therein an opening, an electronic component being incorporated in the opening, the method comprising the steps of: forming the wiring pattern and the via in a plurality of resin base members, and forming in at least one of the plurality of resin base members an opening where the electronic component is incorporated and a wiring pattern at least part of which is disposed in a frame shape surrounding the opening in a periphery of the opening, thereby manufacturing a plurality of printed wiring base members; and batch-laminating the plurality of printed wiring base members by thermo-compression bonding, positioning the plurality of printed wiring base members such that the electronic component is housed in the opening.

Another method of manufacturing a component-incorporated substrate according to one or more embodiments of the present invention is a method of manufacturing a component-incorporated substrate of multi-layer structure in which a plurality of printed wiring base members are batch-laminated via an adhesive layer, the printed wiring base members including a resin base member that has a wiring pattern formed on at least one surface thereof and that has formed therein a via connected to the wiring pattern, at least one printed wiring base member that is sandwiched on both sides by other printed wiring base members, of the plurality of printed wiring base members having formed therein an opening, an electronic component being incorporated in the opening, the method comprising the steps of: forming the wiring pattern and the via in a plurality of resin base members, and forming in at least one of the plurality of resin base members an opening where the electronic component is incorporated and a wiring pattern including a first portion by which connection is made via the via and a second portion extending from the first portion toward an opening end of the opening, at least part of which is formed in a pattern that the second portion is disposed in a frame shape so as to surround the opening in a periphery of the opening, thereby manufacturing a plurality of printed wiring base members; and batch-laminating the plurality of printed wiring base members by thermo-compression bonding, positioning the plurality of printed wiring base members such that the electronic component is housed in the opening.

The present invention makes it possible to achieve downsizing of a substrate overall while securing flatness of the substrate in a periphery of an opening housing an electronic component.

BRIEF DESCRIPTION OF DRAWINGS

FIG. 12 is a view showing a modified example of a wiring pattern of same component-incorporated substrate according to one or more embodiments.

FIG. 13 is a view showing another modified example of the wiring pattern of same component-incorporated substrate according to one or more embodiments.

FIG. 14 is an explanatory diagram of defect modes occurring in a substrate in a working example of same component-incorporated substrate according to one or more embodiments.

DETAILED DESCRIPTION

A component-incorporated substrate and a method of manufacturing the same according to embodiments of the present invention will be described in detail below with reference to the accompanying drawings. However, the embodiments below do not limit the inventions according to each of the claims, moreover, not all of the combinations of features described in the embodiments are necessarily essential to the invention.

Figure 1:
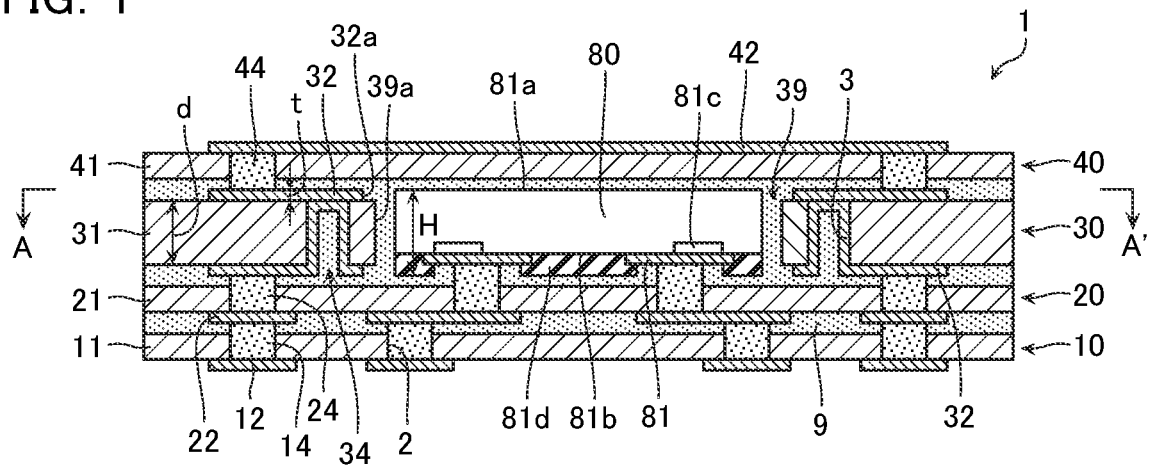
FIG. 1 is a cross-sectional view showing a structure of a component-incorporated substrate according to one or more embodiments of the present invention.

As shown in FIG. 1, a component-incorporated substrate 1 according to one or more embodiments of the present invention has a structure in which a first printed wiring base member 10, a second printed wiring base member 20, a third printed wiring base member 30, and a fourth printed wiring base member 40 are respectively laminated in order from below via an adhesive layer 9, to be batch-laminated by thermo-compression bonding.

Moreover, the component-incorporated substrate 1 includes an electronic component 80 incorporated in a state of having been sandwiched in an up-down direction by the second and fourth printed wiring base members 20, 40, in an opening 39 formed in a certain position (here, a central section) of a third resin base member 31 of the third printed wiring base member 30. There may be adopted as the electronic component 80, for example, an active component configured from a semiconductor element such as a transistor, an integrated circuit (IC), a diode, and so on, or a passive component configured from a passive element such as a resistor, a capacitor, a relay, a piezoelectric element, and so on.

The first through fourth printed wiring base members 10-40 respectively include: a first resin base member 11, a second resin base member 21, the third resin base member 31, and a fourth resin base member 41; and wiring patterns 12, 22, 32, 42 formed on at least one surface of these first through fourth resin base members 11-41. Each of the wiring patterns 12-42, for example, configures a signal-dedicated wiring or functions as a ground (GND)-dedicated wiring, and achieves electrical continuity.

Moreover, the first through fourth printed wiring base members 10-40 respectively include: vias 14, 24, 44 formed by filling in via holes 2 formed in the first, second, and fourth resin base members 11, 21, 41; and a via 34 formed so as to provide electrical continuity between both surfaces of the third resin base member 31, in a via hole 3 formed in the third resin base member 31. Each of the vias 14-44 configures a signal-dedicated via, for example.

Note that these first through fourth printed wiring base members 10-40 can be manufactured using, for example, a single-sided copper clad laminated board (single-sided CCL (Copper Clad Laminate)) or a double-sided copper clad laminated board (double-sided CCL) as a copper clad laminated board (CCL). In one or more embodiments, the third printed wiring base member 30 is manufactured using a double-sided CCL and the other first, second, and fourth printed wiring base members 10, 20, 40 are manufactured using a single-sided CCL. Therefore, the wiring pattern 32 of the third printed wiring base member 30 is formed on both surface sides of the third resin base member 31, and the signal-dedicated via 34 is structured to provide inter-layer connection of fellow wiring patterns 32 of these both surfaces.

In such a case, the via 34 is, for example, configured from a bore-processed plated via due to a laser via hole (LVH) having a structure where a plating is applied inside a penetrating-hole penetrating the wiring pattern 32 on one surface side of the third resin base member 31, without penetrating the wiring pattern 32 on the other surface side of the third resin base member 31. In this case, a plating formed by copper plating may be cited as the plating.

Note that when a plating has been thus applied, an unillustrated plating layer is formed on at least one of the wiring patterns 32. In addition, although illustration thereof is omitted, the inter-layer connection may adopt a configuration where connection is made by filling the inside of the penetrating-hole with a conductive paste instead of plating the inside of the penetrating-hole, or may adopt a configuration where connection is made by a plated through-hole having a structure where a plating is applied inside a penetrating-hole that completely penetrates between each of the wiring patterns 32.

On the other hand, the first through fourth resin base members 11-41 are each configured by a resin film whose thickness d is about 12-50 μm, for example. The following can be used as the resin film, namely, for example, the likes of a resin film configured from a polyimide, a polyolefin, polyethylene terephthalate, a liquid crystal polymer (LCP), and so on, or a resin film configured from a thermosetting epoxy resin, and so on.

The electronic component 80 is the above-mentioned kind of active component, passive component, or the like, and the electronic component 80 shown in FIG. 1 indicates a WLP that has undergone rewiring. An electrode forming surface 81b of the electronic component 80 is provided with a plurality of rewiring electrodes 81 formed on a pad 81c, and an insulating layer 81d is formed in a periphery of the rewiring electrodes 81. The electronic component 80 is formed such that a thickness H including from a reverse surface 81a on an opposite side to the electrode forming surface 81b to a lower surface of the insulating layer 81d will be about 50-150 μm.

The wiring patterns 12-42 are formed by pattern-forming, by etching or the like, a conductor layer 8 (refer to FIG. 8) configured from a conductive material such as a copper foil, and are formed such that their thickness t will be about 12-25 μm. The vias 14, 24, 44 are configured from the conductive paste respectively filled into the via holes 2, and the via 34 is formed by the plating applied to the via hole 3 as described above.

Figure 2:
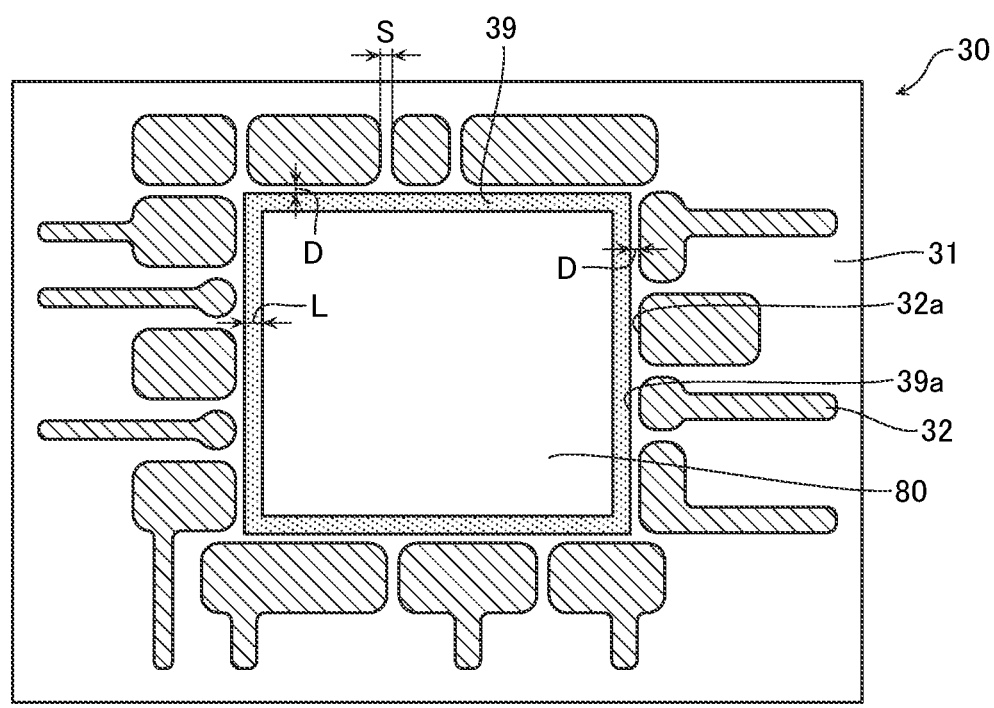
FIG. 2 is a plan view showing a cross section taken along the line A-A' of FIG. 1.

Note that, according to one or more embodiments, the wiring pattern 32 in the third printed wiring base member 30 should be formed in a state where at least part of it is disposed in a frame shape surrounding the opening 39 formed in its central section, in a periphery of this opening 39, and, specifically, as shown in FIG. 2, a plurality of the wiring patterns 32 are formed in a state of being intensively disposed in the frame shape surrounding the opening 39. These wiring patterns 32 are formed such that, for example, a spacing S between adjacent portions where the plurality of wiring patterns 32, 32 have been intensively disposed in the frame shape will fall in a range of approximately from not less than 50 μm to not more than 200 μm (50 μm≤S≤200 μm). Moreover, each of the wiring patterns 32 is, for example, disposed in a position withdrawn or recessed in a horizontal direction from an opening end of the opening 39, specifically, is formed such that a distance (a horizontal distance) D from an end surface 39a of the opening end of the opening 39 to an end surface 32a of an end section on an opening 39 side of the wiring pattern 32 will fall in a range of approximately from not less than 2 μm to not more than 100 μm (2 μm≤D≤100 μm), and, preferably, will be approximately not less than 2 μm and not more than 80 μm (2 μm≤D≤80 μm). This distance D is preferably set to a value which is smaller than the thickness H of the electronic component 80 (D<H).

Note that although in one or more embodiments, the distance D is assumed to exist from the end surface 39a to the end surface 32a as described above, a form in which each of the wiring patterns 32 is formed such that the end surface 32a of its end section will be flush in a vertical direction (so that there is no level difference) with the end surface 39a of the opening end of the opening 39 (0<D≤100 μm), may also be included. Moreover, each of the wiring patterns 32 may partially include a dummy pattern. Although each of these wiring patterns 32 may preferably be formed on both surfaces of the third resin base member 31, they may be formed on at least one surface of the third resin base member 31. Moreover, when formed on both surfaces, they may be formed in positions corresponding in the vertical direction, or may be formed in positions offset in the vertical direction.

By the wiring patterns 32 being intensively disposed in the frame shape surrounding the opening 39 in this way, the adhesive layer 9 on the wiring pattern 32 is appropriately pressed out to enter inside the opening 39, and an appropriate amount of the adhesive layer 9 is left also on the wiring pattern 32, during batch-lamination by thermo-compression bonding. As a result, the second and fourth resin base members 21, 41 in a periphery of the opening 39 are kept unchanged in a flat state.

In the case where, hypothetically, the wiring pattern 32 is not disposed in the frame shape in the periphery of the opening 39, it results in the second and fourth resin base members 21, 41 in the periphery of the opening 39 receding toward the third resin base member 31, as the adhesive layer 9 enters inside the opening 39. These recesses of the resin base members 21, 41 cause deformation throughout the entire substrate, and, in particular, are a factor in recesses appearing in a surface shape of an outermost layer.

In contrast, the component-incorporated substrate 1 according to one or more embodiments has the wiring patterns 32 intensively disposed in the frame shape surrounding the opening 39 as described above, so not only does a frame-like section 111 that was provided in a conventional component-incorporated substrate 100 become unnecessary, but also the second and fourth resin base members 21, 41 in the periphery of the opening 39 never recede during batch-lamination by thermo-compression bonding, and recesses never appear in the surface shape of the outermost layer either.

Note that strictly speaking, the conductive layer 8 does not exist between adjacent wiring patterns 32, hence the recesses of the second and fourth resin base members 21, 41 may occur due to flow of the adhesive layer 9 in this portion. However, because the spacing S between the wiring patterns 32 is set in a range having no effect on this recess, there is no occurrence whatsoever of recesses affecting the surface shape. It is therefore possible to achieve downsizing of the substrate overall to an extent of a frame-like section 111 portion while securing flatness of the printed wiring base members 20, 40 in the periphery of the opening 39, and to suppress occurrence of a mounting defect when another electronic component is further surface-mounted on the component-incorporated substrate 1.

The conductive paste includes, for example, at least one kind of low electrical resistance metal particle selected from the likes of nickel, gold, silver, copper, aluminum, and iron, and at least one kind of low melting point metallic particle selected from the likes of tin, bismuth, indium, and lead. Moreover, the conductive paste is configured from a paste having a binder component composed mainly of an epoxy, an acryl, a urethane, or the like mixed into these metal particles.

The conductive paste configured in this way, for example, has a characteristic that a low melting point metal contained therein can melt and form an alloy at a temperature of 200° C. or less. Moreover, the conductive paste has a characteristic that an intermetallic compound can be formed, particularly with the likes of copper or silver. Therefore, connecting portions of each of the vias 14, 24, 44 and the wiring patterns 12-42 undergo alloying and are firmly connected due to the intermetallic compound during thermo-compression bonding of the batch-lamination.

Note that the conductive paste may also be configured by a nanopaste in which, for example, a filler of the likes of gold, silver, copper, or nickel with a nanolevel particle diameter has been mixed into the above-mentioned kind of binder component. In addition, the conductive paste may be configured from a paste in a form where simply the above-mentioned metal particles of nickel, and so on, have been mixed into the above-described kind of binder component. The conductive paste configured in this way achieves a characteristic that electrical connection is performed by contact between fellow metallic particles.

The following can be employed as a method of filling of the conductive paste into the via hole 2 (and via hole 3) or penetrating-hole, and so on, namely, for example, a printing method, a spin coating method, a spray coating method, a dispensing method, a laminating method, a method combining use of these methods, and so on. Moreover, the first through fourth printed wiring base members 10-40 are laminated via the adhesive layer 9 provided beforehand to the first, second, and fourth printed wiring base members 10, 20, 40.

Figure 3:
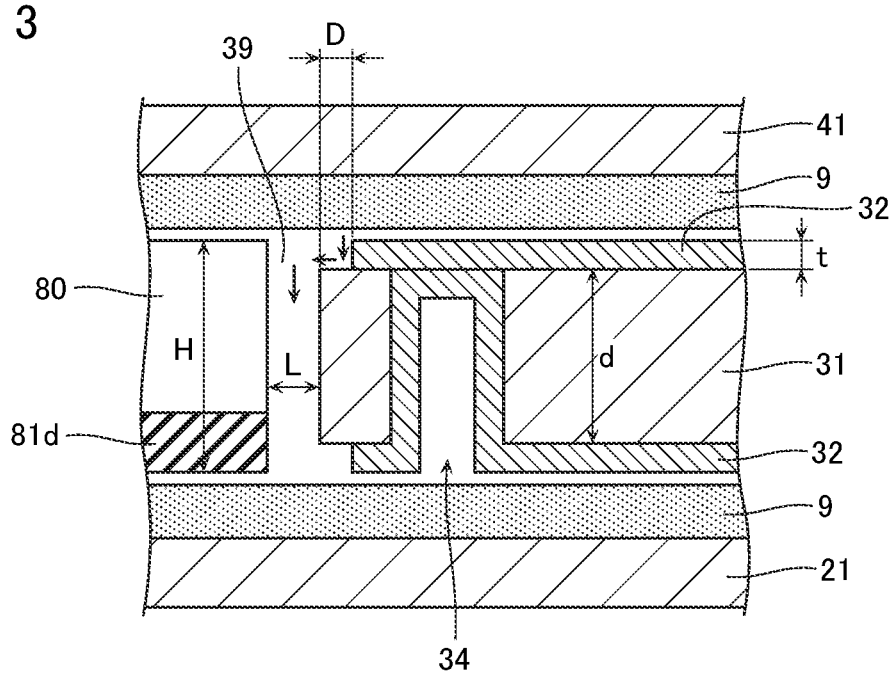
FIG. 3 is an enlarged cross-sectional view of part of FIG. 1.

An adhesive material configuring the adhesive layer 9 is configured from a thermosetting resin for which, for example, there has been set a certain flow amount (a flow amount) in the case of the adhesive material having been softened by heating. Now, as shown in FIGS. 2 and 3, the electronic component 80 in accordance with one or more embodiments is housed in a position separated to an extent of a distance L (for example, approximately 50 μm) from the end surface 39a of the opening 39, in a state of not contacting the opening end in the opening 39. Therefore, in a state before batch-lamination by thermo-compression bonding, a gap occurs between the electronic component 80 and the opening 39.

This gap must be completely filled by the adhesive layer 9, in order to prevent a cavity being made there during the batch-lamination. Therefore, the flow amount of the adhesive layer 9 must be determined after taking into account various design elements of the component-incorporated substrate 1 such as the thickness H of the electronic component 80 or thickness d of the third resin base member 31 and a thickness t of the wiring pattern 32, in addition to a spacing of the above-described gap determined by the distance L.

Specifically, as shown by the thick arrows in the drawing in FIG. 3, during batch-lamination by thermo-compression bonding, the adhesive layer 9 flows from sides of both surfaces of the third printed wiring base member 30 into the gap between the electronic component 80 and the opening 39, so an actual movement distance of the adhesive layer 9 during the batch-lamination will be roughly a distance derived by adding: the distance D between the end surfaces 39a, 32a; the thickness t of the wiring pattern 32; and a thickness d/2 of a half portion of the third resin base member 31, that is, will be roughly a distance (D+t+d/2). Therefore, if the flow amount of the adhesive layer 9 is set longer than this movement distance, then the adhesive layer 9 will be uniformly filled from both above and below into the gap in the opening 39 housing the electronic component 80, so occurrence of the cavity can be completely eliminated.

That is, the flow amount, in the case of it being assumed to be X, can be expressed as X>D+t+d/2, so the distance D between the end surfaces 39*a*, 32*a* can be found according to D<X−t−d/2. Note that the flow amount of the adhesive material is, for example, determined beforehand by flow characteristics of the thermosetting resin. The flow characteristics are determined as, for example, a flow amount of 100 μm in the case of an adhesive material of small flow amount, a flow amount of 200 μm in the case of an adhesive material of large flow amount, and so on. Setting the flow amount in this way makes it possible also to determine each of the design elements around the opening 39 as described above.

Thus, in the component-incorporated substrate 1 according to one or more embodiments, since the conventional frame-like section 111 becomes unnecessary due to the wiring patterns 32 being intensively disposed in the frame shape surrounding the opening 39, and, furthermore, since the distance D between the end surfaces 39*a*, 32*a* and the spacing S between the wiring patterns 32 are determined along with the flow amount of the adhesive material, it is possible to secure flatness of the substrate in the periphery of the opening 39 housing the electronic component 80, achieve downsizing of the substrate overall, and, consequently, suppress occurrence of mounting defects in surface mounting.

Figure 4:
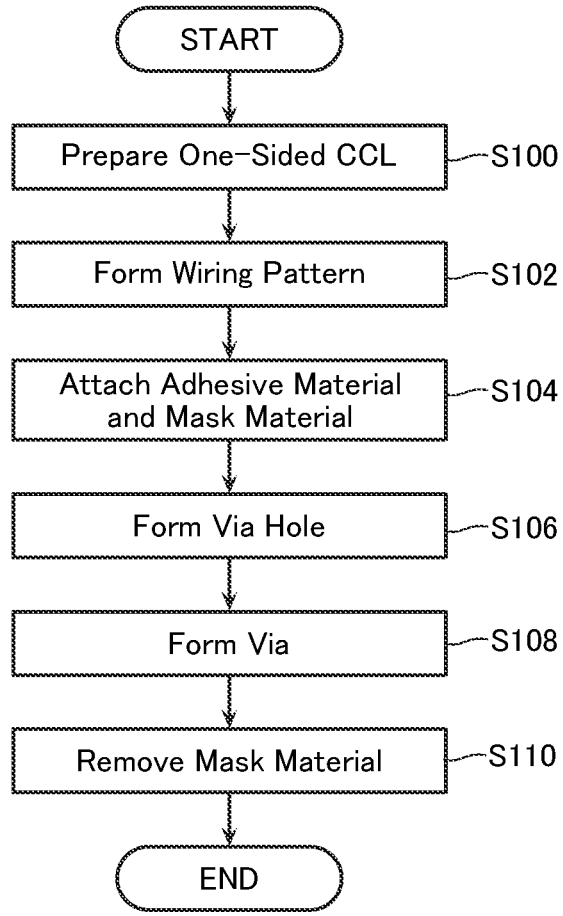
FIG. 4 is a flowchart showing manufacturing steps of same component-incorporated substrate according to one or more embodiments.
Figure 5:
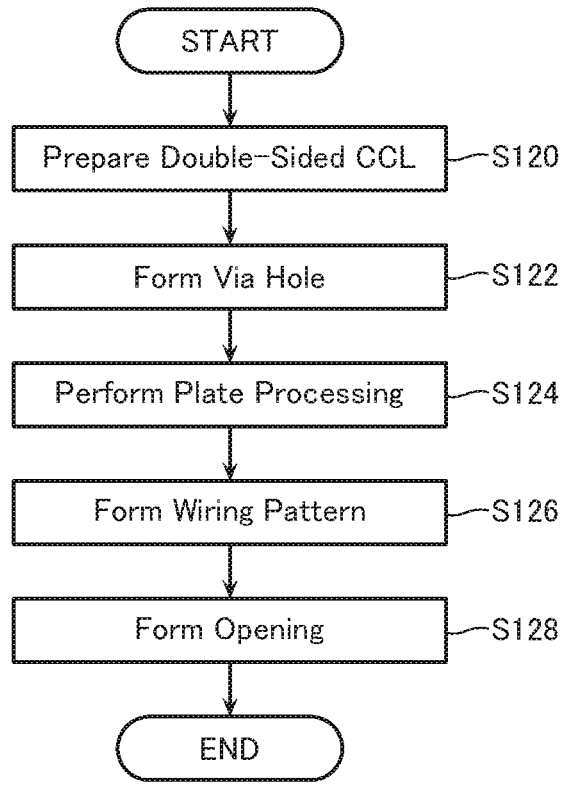
FIG. 5 is a flowchart showing manufacturing steps of same component-incorporated substrate according to one or more embodiments.
Figure 6:
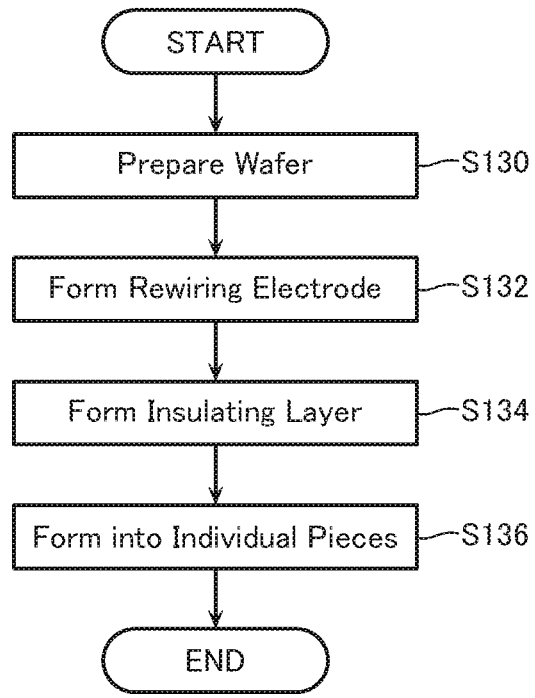
FIG. 6 is a flowchart showing manufacturing steps of an electronic component in the manufacturing steps of same component-incorporated substrate according to one or more embodiments.
Figure 7:
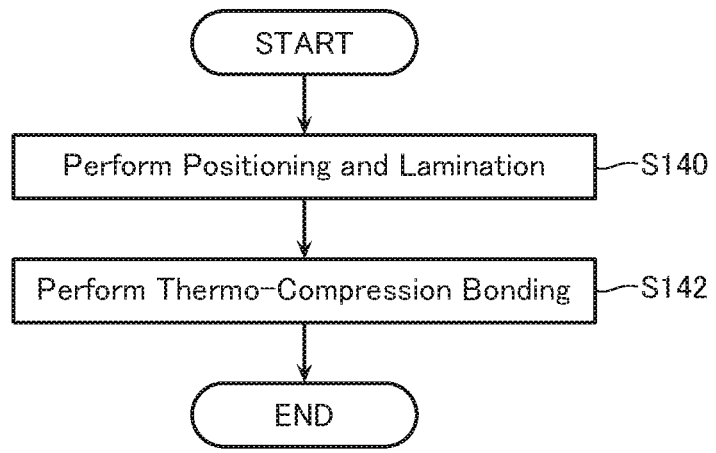
FIG. 7 is a flowchart showing manufacturing steps of same component-incorporated substrate according to one or more embodiments.

Next, a method of manufacturing the component-incorporated substrate 1 according to one or more embodiments will be described with reference to FIGS. 4-11. Note that FIGS. 4 and 8 show details of manufacturing steps for the fourth printed wiring base member 40 according to one or more embodiments, FIGS. 5 and 9 show details of manufacturing steps for the third printed wiring base member 30 according to one or more embodiments, FIGS. 6 and 10 show details of manufacturing steps for the electronic component 80 according to one or more embodiments, and FIGS. 7 and 11 show details of manufacturing steps for final steps of the component-incorporated substrate 1 according to one or more embodiments. Moreover, since the first and second printed wiring base members 10, 20 can be manufactured by similar steps to the manufacturing steps of the fourth printed wiring base member 40, descriptions thereof will be omitted here unless otherwise stated.

Figure 8A:
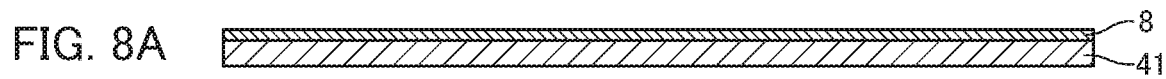
FIGS. 8A-8E are cross-sectional views showing same component-incorporated substrate on a manufacturing step basis according to one or more embodiments.
Figure 8B:
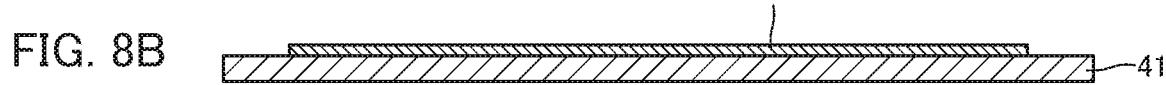

First, manufacturing steps of the fourth printed wiring base member 40 will be described with reference to the flowchart of FIG. 4. As shown in FIG. 8A, a single-sided CCL in which the conductor layer 8 configured from the likes of a copper foil in a so-called solid state is formed on one surface of the fourth resin base member 41, is prepared (step S100). Next, an etching resist (not illustrated) is formed on the conductor layer 8 by photolithography, for example, after which etching is performed to form the wiring pattern 42, as shown in FIG. 8B (step S102).

Now, a single-sided CCL having a structure in which a fourth resin base member 41 of thickness 25 μm has been stuck onto a conductor layer 8 configured from a copper foil of thickness 12 μm, may be cited as one example of the single-sided CCL used in step S100. It is possible to employ as this single-sided CCL, for example, a single-sided CCL manufactured by applying a polyimide varnish to a copper foil by a publicly known casting method, and hardening the varnish.

In addition, the following may also be employed as the single-sided CCL, namely, the likes of a single-sided CCL in which a polyimide film has a seed layer formed thereon by sputtering, and copper is grown thereon by plating to form the conductor layer 8, or a single-sided CCL manufactured by sticking together a rolled or electrolytic copper foil and a polyimide film by an adhesive material.

Note that the fourth resin base member 41 is not necessarily required to adopt a polyimide film as its base material (base), and, as mentioned above, may adopt as its base material a plastic film, such as a liquid crystal polymer. Moreover, an etchant composed mainly of ferric chloride or cupric chloride may be employed in the above-described etching is step S102.

Figure 8C:
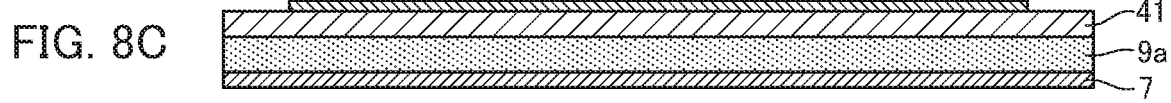

When the wiring pattern 42 has been formed in this way, then, as shown in FIG. 8C, an adhesive material 9*a* and a mask material 7 are attached, by thermal press bonding, to a surface on an opposite side to a side of a wiring pattern 42 forming surface of the fourth resin base member 41 (step S104). An epoxy system thermosetting resin film of thickness 25 μm may be cited as one example of the adhesive material 9*a* attached in this step S104. The thermal press bonding may be implemented by employing, for example, a vacuum laminator to stick these materials and member together by pressing using a pressure of, for example, 0.3 MPa, at a temperature that the adhesive material 9*a* does not harden, in a reduced pressure atmosphere.

Note that there may be cited as the adhesive material 9*a* configuring the inter-layer adhesive layer 9 not only an epoxy system thermosetting resin, but also the likes of an acrylic system adhesive material or a thermoplastic adhesive material typified by a thermoplastic polyimide, or the like. Moreover, the adhesive material 9*a* is not necessarily required to be in a film state, and may be coated with a resin in a varnish state. Moreover, regarding the mask material 7, various kinds of films capable of being adhered or detached by UV irradiation, may be employed for this, in addition to the above-mentioned resin film or plastic film of the likes of polyethylene terephthalate (PET) or polyethylene naphthalate (PEN).

Figure 8D:
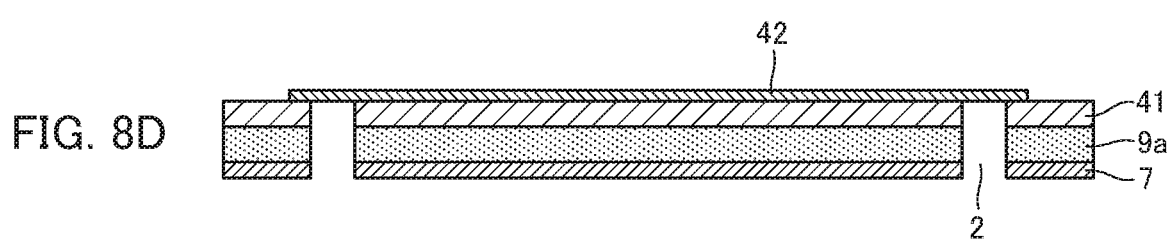

Then, a UV-YAG laser device, for example, is employed to irradiate laser light from an attached mask material 7 side toward the wiring pattern 42, and, as shown in FIG. 8D, the via hole 2 of a penetrating-hole penetrating the mask material 7, the adhesive material 9*a*, and the fourth resin base material 41 is formed in a certain place (step S106). A diameter of the via hole 2 is set to, for example, 30-80 μm, and an inside of the via hole 2 after formation undergoes a plasma desmear processing, for example.

The via hole 2 formed in this step S106 may otherwise by formed by the likes of a carbon dioxide laser ($CO_2$ laser) or an excimer laser, or may be formed by the likes of drill processing or chemical etching. Moreover, the desmear processing, although capable of being performed by a mixed gas of $CF_4$ and $O_2$ (tetrafluoromethane+oxygen), may also employ another inert gas such as Ar (argon). Moreover, the desmear processing may be configured as a wet desmear processing employing a chemical solution, rather than a so-called dry processing.

Figure 8E:
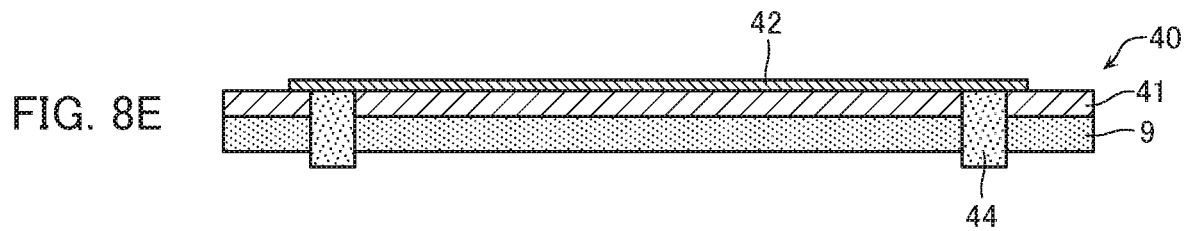

The inside of the via hole 2 formed in this way is filled with the conductive paste having the above-mentioned kind of configuration, by, for example, screen printing, or the like, to form the via 44 (step S108), and, as shown in FIG. 8E, the mask material 7 is removed by peeling (step S110), whereby a series of manufacturing steps according to the present flowchart ends.

Such steps make it possible to manufacture the fourth printed wiring base member 40 that includes the fourth resin base member 41 provided with the adhesive layer 9 and having formed therein the via 44 in a state of its end section projecting slightly from a surface of the adhesive layer 9. Note that the first and second printed wiring base members 10, 20 are also similarly manufactured, and that, in the case of an even greater number of layers, preparations should be made to form the additional printed wiring base members.

Figure 9A:
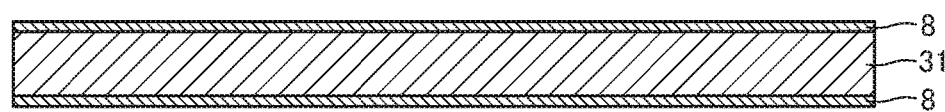
FIGS. 9A-9E are cross-sectional views showing same component-incorporated substrate on a manufacturing step basis according to one or more embodiments.
Figure 9B:
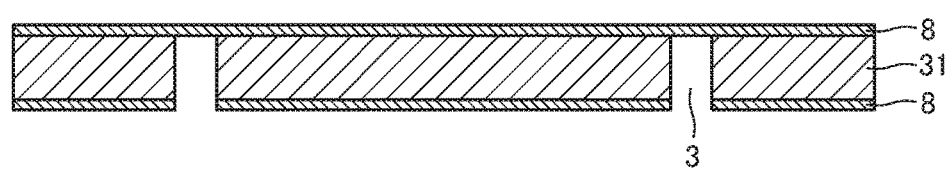
Figure 10A:
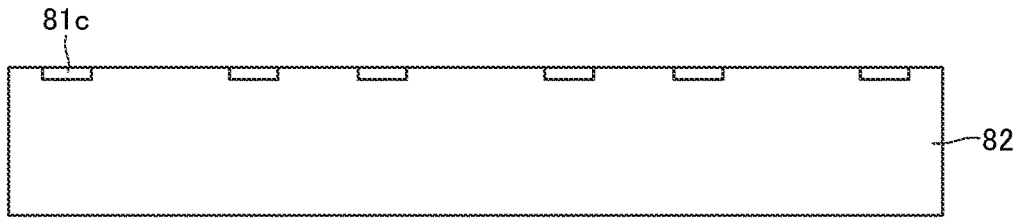
FIGS. 10A-10D are cross-sectional views showing the electronic component incorporated in same component-incorporated substrate, on a manufacturing step basis according to one or more embodiments.

Next, manufacturing steps of the third printed wiring base member 30 will be described with reference to the flowchart of FIG. 5. Note that in the description below, portions or places that have already been described will be assigned with the same reference symbols as before and descriptions thereof will sometimes be omitted, and that, regarding specific processing content of each of the steps, the above-mentioned content is assumed to be appropriately applicable. First, as shown in FIG. 9A, a double-sided CCL having the conductor layer 8 formed on both surfaces of the third resin base member 31, is prepared (step S120), and, as shown in FIG. 9B, the via hole 3 is formed in a certain place (step S122), and, for example, the plasma desmear processing is performed.

Figure 9C:
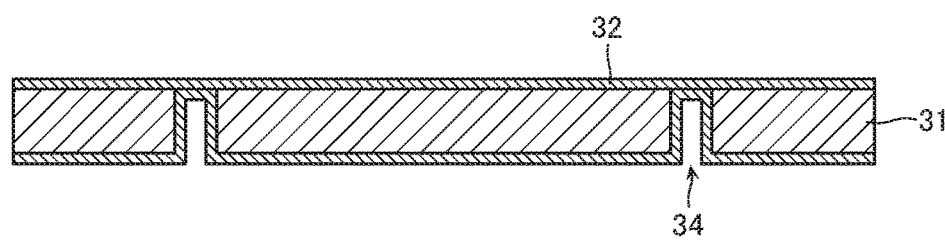
Figure 9D:
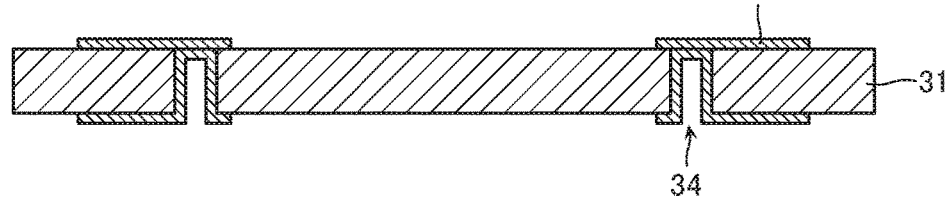

Next, as shown in FIG. 9C, panel plate processing, for example, is performed on an entire surface of the third resin base member 31 (step S124) to form an unillustrated plating layer on the conductor layer 8 and inside the via hole 3, and thereby form prototypes of the wiring pattern 32 and the via 34. Then, as shown in FIG. 9D, etching, and soon, is performed on both surfaces of the third resin base member 31 to form a wiring pattern including each of sections such as the wiring pattern 32 or via 34 (step S126). At this time, as mentioned above, the wiring pattern 32 is formed in plurality around a place that will later be the opening 39, in a form where at least part thereof is intensively disposed in a frame shape surrounding this opening 39.

Figure 9E:

When the wiring pattern has been formed in this way, then finally, as shown in FIG. 9E, the third resin base member 31 at a portion thereof where the electronic component 80 is to be incorporated is removed by irradiating with laser light using a UV-YAG laser device, or the like, such that a certain opening diameter thereof will be at least 50 μm larger than an outer shape of the electronic component 80 over an entire periphery in a radial direction from a center of the electronic component 80, for example, and the opening 39 having this certain opening diameter is formed (step S128), whereby a series of manufacturing steps according to the present flowchart ends. Such steps make it possible to manufacture the third printed wiring base member 30.

Moreover, the electronic component 80 incorporated in the opening 39 of the third printed wiring base member 30 manufactured in this way is manufactured, for example, as follows. Manufacturing steps of the electronic component 80 will be described here with reference to the flowchart of FIG. 6. First, as shown in FIG. 10A, a pre-dicing wafer 82 having formed therein an inorganic insulating layer of the likes of silicon oxide or silicon nitride, is prepared (step S130).

Figure 10B:
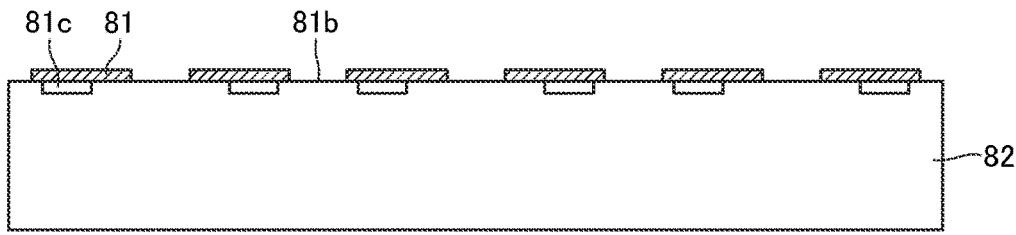
Figure 11:
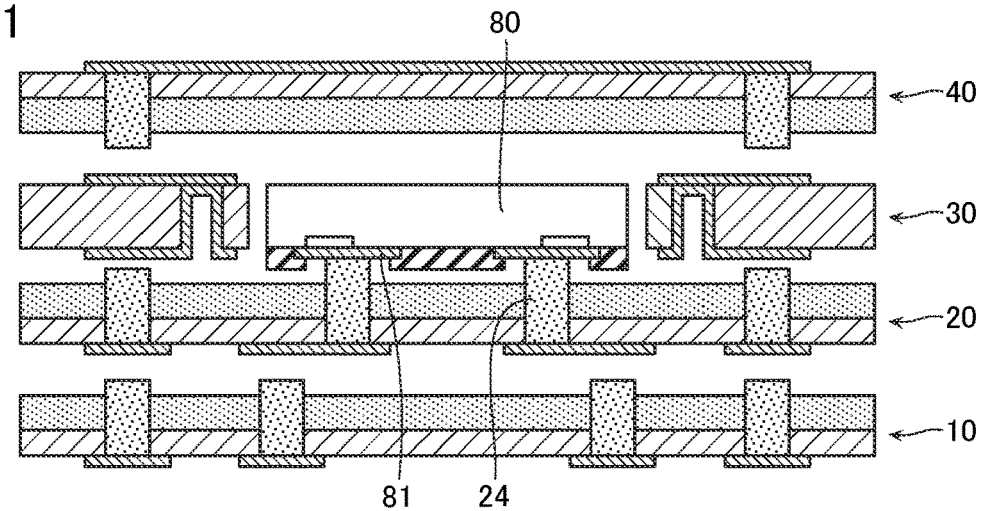
FIG. 11 is a cross-sectional view showing same component-incorporated substrate on a manufacturing step basis according to one or more embodiments.

When the wafer 82 has been prepared, then, as shown in FIG. 10B, the rewiring electrode 81 covering an unillustrated conductor circuit or the pad 81c of the electronic component 80, is formed on the pad 81c and on the inorganic insulating layer, in a surface of the prepared wafer 82, by a semi-additive method, for example (step S132).

Figure 10C:
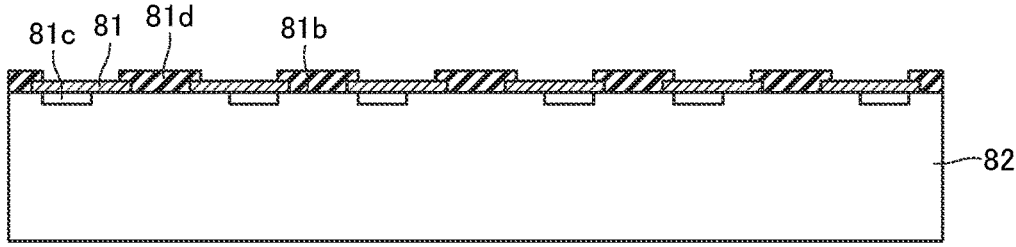
Figure 10D:
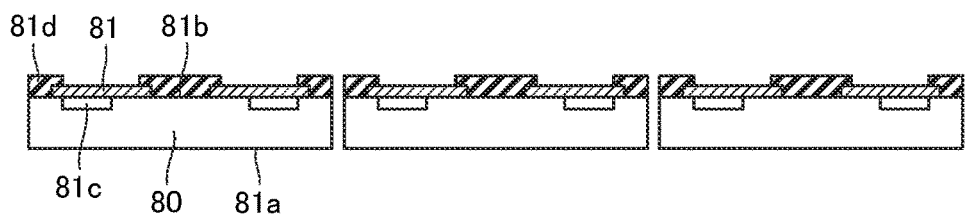

Then, as shown in FIG. 10C, a contact hole is formed by, for example, spin-coating a liquid-form photosensitive polyimide precursor and performing photolithography, and then the insulating layer 81d is formed by calcination (step S134). Finally, testing is performed by probing, and as shown in FIG. 10D, a plurality of the electronic components 80 are manufactured by being formed into individual pieces by thinning and dicing (step S136).

Note that the following may be employed as a resin of the insulating layer 81d formed in the above-described step S134, namely, the likes of benzo-cyclo-butene (BCB) or poly-benzo-oxazole (PBO), for example. Moreover, the photosensitive resin does not necessarily need to be coated by spin coating, and may be coated by curtain coating or screen printing, or by spray coating, and so on. The electronic component 80 manufactured in this way may also be provided with each of functions of an inductor, a capacitor, a resistance, and so on, as well as an ordinary conductive circuit.

Finally, the final steps of the component-incorporated substrate 1 will be described with reference to the flowchart of FIG. 7. When the first through fourth printed wiring base members 10-40 and the electronic component 80 have been manufactured in the above manner, then, as shown in FIG. 11, the rewiring electrode 81 of the electronic component 80 and the via 24 of the second printed wiring base member 20 are aligned by an electronic component mounting device, and the electronic component 80 is provisionally adhered to the second printed wiring base member 20 in a state where the adhesive layer 9 of the second printed wiring base member 20 and the conductive paste of the via 24 are unhardened.

Then, each of the printed wiring base members 10-40 and the electronic component 80 are positioned and laminated, specifically, are positioned such that the electronic component 80 is contained in non-contact with the opening end in the opening 39 of the third printed wiring base member 30 in a state where the second and fourth printed wiring base members 20, 40 each have their adhesive layer 9 directed to a third printed wiring base member 30 side, and laminated (step S140). Finally, for example, a vacuum press is employed to perform batch-lamination by thermo-compression bonding by applying heat and pressure in a reduced pressure atmosphere of 1 kPa or less (step S142), whereby a series of manufacturing steps according to the present flowchart ends and the component-incorporated substrate 1 of the kind shown in FIG. 1 is manufactured.

Thus, in the method of manufacturing the component-incorporated substrate 1 according to one or more embodiments, the first through fourth printed wiring base members 10-40 are batch-laminated by thermo-compression bonding in a state where the third printed wiring base member 30 in which at least part of a plurality of the wiring patterns 32 is intensively disposed in a frame shape surrounding the opening 39, is sandwiched by the second and fourth printed wiring base members 20, 40. As a result, the adhesive layers 9 of the second and fourth printed wiring base members 20, 40 enter the gap between the electronic component 80 and the opening 39 uniformly from upper and lower directions, so a cavity is never formed in this gap, moreover, the second and fourth resin base members 21, 41 never recede toward the third resin base member 31 in the periphery of the opening 39 either, so it is possible to manufacture a component-incorporated substrate 1 that can achieve downsizing of the substrate overall while securing flatness of the substrate in the periphery of the opening 39 housing the electronic component 80. In the component-incorporated substrate 1 manufactured in this way, recesses are suppressed in its surface shape too, hence it is possible to effectively suppress occurrence of mounting defects during surface mounting.

Note that the wiring patterns 32 formed in the third printed wiring base member 30 according to one or more embodiments may be provided as shown in FIGS. 12 and 13. First, as shown in FIG. 12, the wiring patterns 32 of one modified example each have, in part, a round-cornered triangular kind of shape when seen in planar view. Moreover, the wiring patterns 32 each have one side of each of their sides aligned so as to be parallel to the end surface 39a of the opening end of the opening 39 and so as to form a straight line, and are each disposed in a state of being separated at intervals of the spacing S. If the wiring patterns 32 are thus disposed, each of the wiring patterns 32 can be intensively disposed in the periphery of the opening 39 in a form exceedingly close to a continuous frame, so the above-mentioned operational advantages can be made even more easily displayed.

Moreover, as shown in FIG. 13, the wiring patterns 32 of another modified example each have, in part, a round-cornered parallelogram kind of shape when seen in planar view. Moreover, the wiring patterns 32 each have one side of each of their sides aligned so as to be parallel to the end surface 39a of the opening end of the opening 39 and so as to form a straight line, and are each disposed in a state of being separated at intervals of the spacing S such that fellow sides facing each other in an adjacent direction meet obliquely with respect to the end surface 39a. If the wiring patterns 32 are thus disposed, similar operational advantages to those of the above-described one modified example, are displayed. Moreover, along with this, since a portion where the spacing S occurs (a portion where the wiring pattern 32 is not formed) is disposed obliquely with respect to the end surface 39a as described above, the following characteristics are obtained compared to when the portion where the spacing S occurs is disposed linearly in a direction indicated by the arrow in the drawing.

That is, since the portion where the spacing S occurs does not have the wiring pattern 32 formed therein, then, when the surface of the wiring pattern 32 is taken as a reference, it results in a level difference (recess) from that surface to a surface of the third resin base member 31 existing. In this case, the adhesive layer 9 flows also into a level difference portion during the batch-lamination by thermo-compression bonding.

At this time, if the portion where the spacing S occurs is disposed obliquely with respect to the end surface 39a, then when viewed in per unit area terms, it is possible to configure a level difference (recess) that is small even though its range is broad rather than being able to make a level difference (recess) that is locally large, compared to when the portion where the spacing S occurs is disposed linearly as described above. Therefore, an effect of inflow of the adhesive layer 9 to this level difference portion can be reduced, and further suppression of recesses in the periphery of the opening 39, of the second and fourth resin base members 21, 41 may be expected. In this way, it is possible for the wiring patterns 32 to be formed disposed in the frame shape in a variety of shapes.

WORKING EXAMPLE

Next, a working example of the component-incorporated substrate 1 according to one or more embodiments will be described.

In the present working example, first, component-incorporated substrates 1 formed by changing a material quality of the adhesive material configuring the adhesive layer 9, the thickness H of the electronic component 80, the distance D between the end surfaces 39a, 32a, and the spacing S between the wiring patterns 32, were experimentally manufactured as a variety of sample substrates. Then, a variety of defect modes occurring in each of the sample substrates were observed, and an optimum value of each of design elements of the above-mentioned component-incorporated substrate 1 was found.

Regarding the defect modes according to one or more embodiments, as shown in FIG. 14, 0 indicates no defect, 1 indicates an inter-component/pattern insulation defect, 2 indicates an adhesive material filling defect, and 3 indicates a substrate surface flatness defect. Regarding the adhesive material configuring the adhesive layer 9, an adhesive material A was assumed to have a small flow amount of 100 μm, and an adhesive material B was assumed to have a large flow amount of 200 μm. Regarding the incorporated electronic component 80, three of these whose thickness H of the component was (1) 0.05 mm, (2) 0.1 mm, and (3) 0.15 mm, were prepared for each of the adhesive materials A, B.

Figures 15, 16:
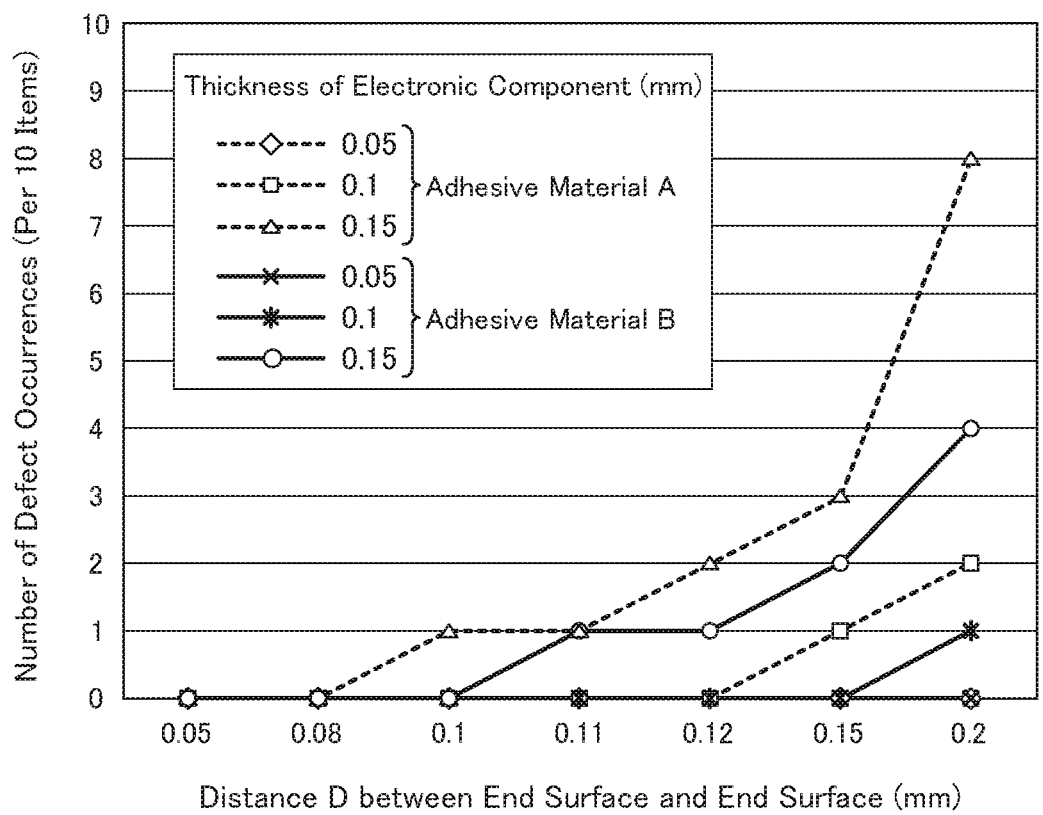
FIG. 15 is a view showing a relationship of the defect mode and a distance D of the component-incorporated substrate in same working example according to one or more embodiments.
FIG. 16 is a view showing a relationship of the number of defect occurrences and the distance D of the component-incorporated substrate in same working example according to one or more embodiments.

Moreover, the wiring patterns 32 were intensively disposed in the frame shape, being set such that the distance D between the end surfaces 39a, 32a would be 10 kinds of different values in a range from 0 mm to 0.2 mm. At this time, the spacing S between adjacent wiring patterns 32 was set to 50 μm. A relationship of the defect modes generated in the experimentally manufactured sample substrates according to one or more embodiments and the distance D between the end surfaces 39a, 32a (hereafter, called "distance D") under the above conditions, is summarized as shown in FIG. 15.

First, in the case of employing the adhesive layer 9 configured by the adhesive material A, when the distance D was 0 mm, an inter-component/pattern insulation defect occurred due to contact of the electronic component 80 and the wiring pattern 32, for all of the above-described component thicknesses (1)-(3). Moreover, when the distance D was 0.001 mm, an inter-component/pattern insulation defect occurred only at a time of the component thickness (3).

Moreover, it was confirmed that when the distance D was any of 0.002 mm, 0.005 mm, 0.01 mm, 0.02 mm, and 0.05 mm, a defect did not occur for any of the component thicknesses (1)-(3). Note that when the distance D was 0.1 mm, an adhesive material filling defect occurred only at a time of the component thickness (3).

Furthermore, although when the distance D was 0.15 mm and 0.2 mm, a defect did not occur for each of these for the component thickness (1), an adhesive material filling defect occurred at a time of the component thickness (2), and, at a time of the component thickness (3), an adhesive material filling defect and a substrate surface flatness defect occurred concurrently. It was established from the above that the distance D in the case of employing the adhesive material A as the adhesive layer 9 is preferably set in a range of 0.002-0.05 mm.

Next, in the case of employing the adhesive layer 9 configured by the adhesive material B, when the distance D was 0 mm, an inter-component/pattern insulation defect occurred for all of the component thicknesses (1)-(3). Moreover, it was confirmed that when the distance D was any of 0.001 mm, 0.002 mm, 0.005 mm, 0.01 mm, 0.02 mm, and 0.05 mm, and 0.1 mm, a defect did not occur for any of the component thicknesses (1)-(3). Note that when the distance D was 0.15 mm, a substrate surface flatness defect occurred only at a time of the component thickness (3).

Furthermore, although when the distance D was 0.2 mm, a defect did not occur for the component thickness (1), a substrate surface flatness defect occurred for each of the component thicknesses (2) and (3). It was established from the above that the distance D in the case of employing the adhesive material B as the adhesive layer 9 is preferably set in a range of 0.001-0.1 mm.

Moreover, a relationship of the number of defect occurrences of the adhesive material filling defect or the substrate surface flatness defect per 10 items of the experimentally manufactured sample substrates according to one or more embodiments and the distance D, is summarized in graph form as shown in FIG. 16. According to this graph, it may be understood that although in the case where the adhesive material A was employed as the adhesive layer 9 when the distance D was 0.2 mm, a defect did not occur at a time of the component thickness (1), a defect occurred in two items at a time of the component thickness (2), and a defect occurred in eight items at a time of the component thickness (3). In addition, it may be understood that although in the case where the adhesive material B was employed as the adhesive layer 9 when the distance D had the same conditions, a defect did not occur at a time of the component thickness (1), a defect occurred in one item at a time of the component thickness (2), and a defect occurred in four items at a time of the component thickness (3).

Similarly, although in the case where the adhesive material A was employed when the distance D was 0.15 mm, a defect did not occur at a time of the component thickness (1), a defect occurred in one item at a time of the component thickness (2), and a defect occurred in three items at a time of the component thickness (3). Moreover, although in the case where the adhesive material B was employed with conditions being the same for the distance D, a defect did not occur at a time of the component thicknesses (1) and (2), a defect occurred in two items at a time of the component thickness (3).

Moreover, it may be understood that in the case where the adhesive material A was employed when the distance D was 0.12 mm, a defect occurred in two items, only at a time of the component thickness (3), and it may be understood that in the case where the adhesive material B was employed with conditions being the same for the distance D, a defect occurred in one item, only at a time of the component thickness (3). Moreover, it may be understood that in both the case where the adhesive material A was employed and the case where the adhesive material B was employed when the distance D was 0.11 mm, a defect occurred in one item for each of these cases, only at a time of the component thickness (3).

Furthermore, it may be understood that in the case where the adhesive material A was employed when the distance D was 0.10 mm, a defect occurred in one item, only at a time of the component thickness (3). Moreover, it may be understood that when the distance D was 0.08 mm and 0.05 mm, a defect did not occur in both the case where the adhesive material A was employed and the case where the adhesive material B was employed.

It may be understood from this that the thicker the thickness H of the electronic component 80 is, or the smaller the flow amount of the adhesive material configuring the adhesive layer 9 is, the higher the occurrence rate of defects in the sample substrate is. For example, if the distance D is 0.10 mm or less, occurrence of defects can be overcome by setting the thickness H of the electronic component 80 to 0.1 mm or less, or by employing the adhesive material B to configure the adhesive layer 9.

Now, it may be understood from the results shown in FIG. 16 that by setting the distance D to 0.08 mm or less, both the adhesive material A and the adhesive material B may be adopted as the adhesive layer 9. In such a case, a defect will not occur in the substrate even if a component whose thickness H is 0.15 mm, thicker than a standard component, is employed. Thus, by setting an appropriate distance D, a permitted height limit of the incorporated electronic component 80 is relaxed, so incorporation of a so-called general-purpose component becomes possible, and an advantage of an application field of the component-incorporated substrate 1 being extended, may be expected.

Note that a numerical value of 0.08 mm of the distance D can be found as follows, for example, from the above-mentioned expressions $X > D + t + d/2$ and $D < X - t - d/2$ in the embodiments described above. That is, if the thickness t of the wiring pattern 32 and the thickness d of the third resin base member 31 are each set to 0.012 mm and the flow amount X of the adhesive layer 9 is set to 0.1 mm, then it results in $0.1 > D + 0.012 + 0.006$ and $D < 0.1 - 0.018 = 0.082$, so D can be specified by $D < 0.08$ mm.

Figures 17, 18:
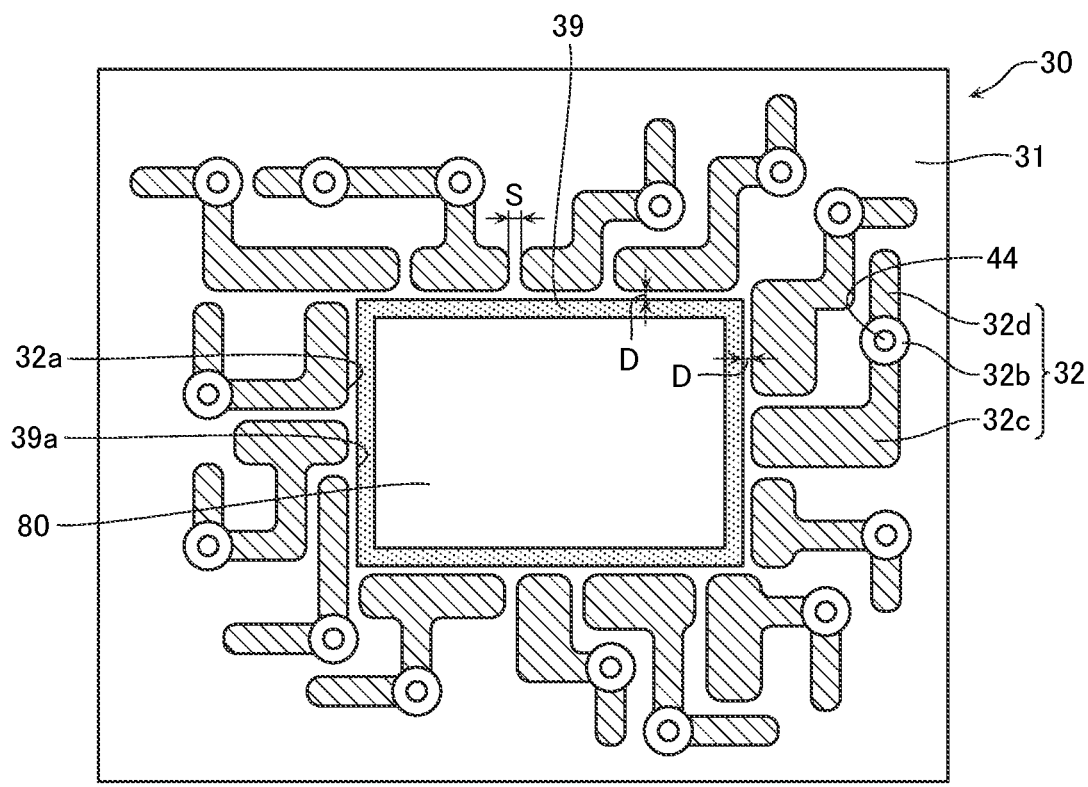
FIG. 17 is a view showing a relationship of the defect mode and a spacing S of the component-incorporated substrate in same working example according to one or more embodiments.
FIG. 18 is a plan view of a portion corresponding to the cross section taken along the line A-A' of FIG. 1, showing a structure of a component-incorporated substrate according to one or more embodiments of the present invention.

Next, a relationship of the defect modes generated in the experimentally manufactured component-incorporated substrate 1 according to one or more embodiments and the spacing S between the wiring patterns 32 (hereafter, called "spacing S"), is summarized as shown in FIG. 17. Note that FIG. 17 shows only the cases where the adhesive layer 9 is configured by the adhesive material A, and the component thicknesses (2) and (3) are employed.

First, it was confirmed that when the spacing S was any of 0.05 mm, 0.1 mm, and 0.2 mm, a defect did not occur for either of the component thicknesses (2) and (3). Note that although when the spacing S was both 0.3 mm and 0.5 mm, a defect did not occur in either of these cases for the component thickness (2), a substrate surface flatness defect occurred in both cases only at a time of the component thickness (3). Moreover, when the spacing S is less than 0.05 mm, there is an increase in the possibility of an insulation defect between the wiring patterns 32 occurring due to a limit of photolithography. It was established from the above that the spacing S in the case of employing the adhesive material A as the adhesive layer is preferably set in a range of 0.05-0.2 mm.

Therefore, if a plurality of the wiring patterns 32 are formed in a state of having been intensively disposed in a frame shape surrounding the opening 39 such that the spacing S is set in a range of from not less than 50 μm to not more than 200 μm, and the distance D is set in a range of from not less than 2 μm to not more than 100 μm, preferably, in a range of from not less than 2 μm to not more than 80 μm, it is possible to achieve a component-incorporated substrate 1 that can achieve downsizing of the substrate overall while securing flatness of the substrate in the periphery of the opening 39, and that can suppress occurrence of mounting defects during surface mounting.

Next, a component-incorporated substrate 1 according to one or more embodiments will be described.

As shown in FIG. 18, in the component-incorporated substrate 1 according to one or more embodiments, at least part of each of the wiring patterns 32 provided in the periphery of the opening 39 of the third printed wiring base member 30 each includes, for example: a first portion 32b connected via the via 44 of the fourth printed wiring base member 40; and a second portion 32c extending from this first portion toward the opening end of the opening 39, and the at least part of each of the wiring patterns 32 is formed in a pattern that the second portion 32c is intensively disposed in the frame shape so as to surround the opening 39, and, in these points, the wiring pattern 32 differs from the wiring pattern 32 of the third printed wiring base member 30 in the component-incorporated substrate 1 according to the embodiments described above.

Note that the wiring pattern 32 of the component-incorporated substrate 1 according to one or more embodiments further includes a third portion 32d formed in a pattern so as not to overlap the second portion 32c via the first portion 32b. Regarding the thus configured wiring patterns 32, when a plurality of the wiring patterns 32 are pattern-formed by the likes of etching in the above-mentioned step S126 in the manufacturing steps of the third printed wiring base member 30, the thus configured wiring patterns 32 each include the second portion 32c at least part of which extends from the first portion 32b connected via the via 44 toward a place that will later be the opening 39, for example, and are manufactured by being formed in a pattern that this second portion 32c is intensively disposed in the frame shape so as to surround the periphery of the opening 39.

In the component-incorporated substrate 1 according to one or more embodiments thus configured to include the wiring pattern 32 having the first through third portions 32b-32d, similar operational advantages to those of the component-incorporated substrate 1 and method of manufacturing the same according to the embodiments described above can be displayed, and, since the first portion 32b of the wiring pattern 32 is connected to a via, design flexibility of the likes of conduction or heat dissipation can be further improved.

Next, a component-incorporated substrate 1 according to one or more embodiments will be described.

Figure 19:
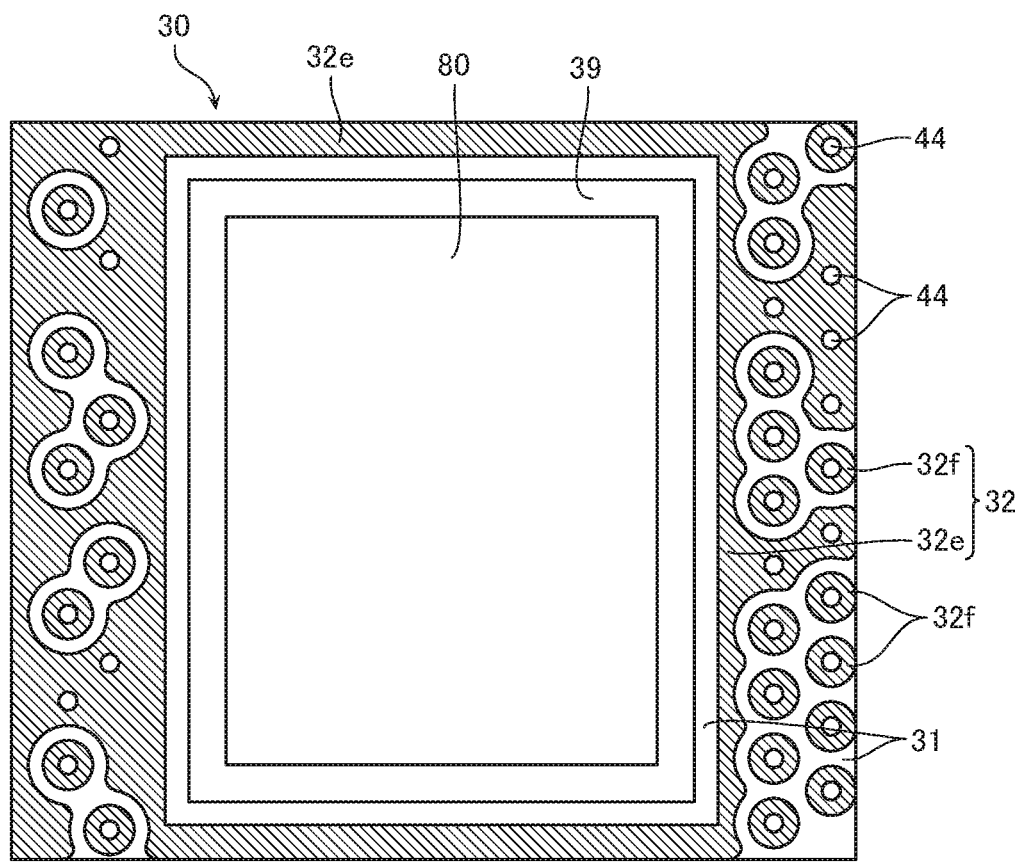
FIG. 19 is a plan view of a portion corresponding to the cross section taken along the line A-A' of FIG. 1, showing a structure of a component-incorporated substrate according to one or more embodiments of the present invention.
Figure 20:
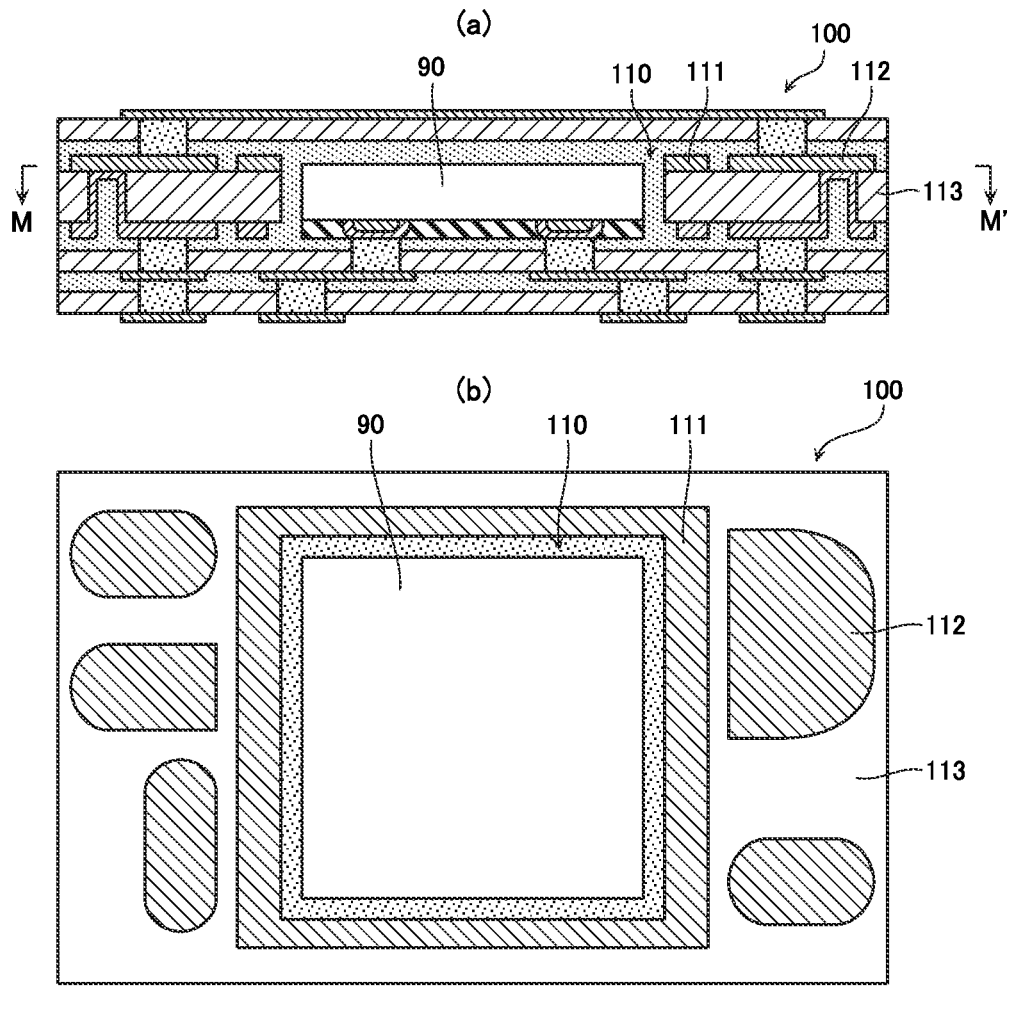
FIGS. 20A-20B include schematic views showing an overall configuration of a component-incorporated substrate according to a conventional example, with FIG. 20A being a cross-sectional view and FIG. 20B being a plan view showing a cross section taken along the line M-M' of FIG. 20A.

Note that in FIG. 19, the wiring pattern 32 according to one or more embodiments is indicated by hatching.

As shown in FIG. 19, in the component-incorporated substrate 1 according to one or more embodiments, the wiring pattern 32 is formed on the third resin base member 31 of the third printed wiring base member 30 where the opening 39 is formed. The wiring pattern 32 includes a solid pattern 32e and a land pattern 32f. In the component-incorporated substrate 1, at least part of the thus formed wiring pattern 32 (the solid pattern 32e) is disposed in the frame shape surrounding the opening 39, in the periphery of the opening 39, and, in this point, the component-incorporated substrate 1 differs from the component-incorporated substrates 1 according to the first and second embodiments.

That is, in the wiring pattern 32, the solid pattern 32e provided in the frame shape in the periphery of the opening 39 is configured by at least part of the wiring pattern 32 formed on the third resin base member 31, and the land pattern 32f is configured by being formed in the solid pattern 32e in a state of being insulated so as to avoid electrical conduction with the solid pattern 32e. Note that the solid pattern 32e aims to achieve electrical conduction with a circuit, or the like, of another layer, by the via 44, and so on, hence differs from a simple frame-like pattern.

In the component-incorporated substrate 1 according to one or more embodiments configured to include the wiring pattern 32 formed in this way, similar operational advantages to those of the component-incorporated substrates 1 and methods of manufacturing the same according to the first and second embodiments can be displayed, and it becomes possible for mechanical strength around the opening 39 to be further increased.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the gist of the inventions. The accompanying claims and their equivalents are intended to cover such forms or modifications as would fall within the scope and gist of the inventions.

For example, in the above-described embodiments, explanation was made citing as examples two kinds of the flow amount, that is, small and large, for the adhesive material configuring the adhesive layer 9. However, the present invention may be configured so as to adopt an adhesive material in which further different flow amounts have been set, and to set values of the distance D or spacing S. Moreover, provided there is a portion of the wiring pattern 32 intensively disposed in the frame shape surrounding the periphery of the opening 39, the shape of the wiring pattern 32 is not limited to the above-described shapes or arrangement forms.

DESCRIPTION OF REFERENCE NUMERALS

1 . . . component-incorporated substrate
2, 3 . . . via hole
7 . . . mask material
8 . . . conductor layer
9 . . . adhesive layer
9a . . . adhesive material
10 . . . first printed wiring base member
11 . . . first resin base member
12, 22, 32, 42 . . . wiring pattern
14, 24, 34, 44 . . . via
20 . . . second printed wiring base member
21 . . . second resin base member
30 . . . third printed wiring base member
31 . . . third resin base member
32a, 39a . . . end surface
39 . . . opening
40 . . . fourth printed wiring base member
41 . . . fourth resin base member
80 . . . electronic component

The invention claimed is:
1. A component-incorporated substrate of multi-layer structure comprising:
  an electronic component; and
  a first printed wiring base member, a second printed wiring base member, and a third printed wiring base member that are batch-laminated via an adhesive layer, wherein
  each of the first, second, and third printed wiring base members comprises:
    a resin base member;
    a wiring pattern disposed on at least one surface of the resin base member; and
    a via connected to the wiring pattern,
  the first printed wiring base member is sandwiched by the second printed wiring base member and the third printed wiring base member,
  the electronic component is disposed in an opening of the first printed wiring base member,
  the first printed wiring base member further comprises first wiring patterns disposed in a frame shape surrounding the opening in a periphery of the opening,
  the adhesive layer fills:
    a gap between the electronic component and the opening, and
    gaps between the first wiring patterns and the second printed wiring base member on a side of the first wiring patterns, and at least one of the first wiring patterns is connected to at least one of:
the via of the first printed wiring base member, and
the via of the second printed wiring base member.

2. The component-incorporated substrate according to claim 1, wherein spacing between adjacent ones of the first wiring patterns is greater than or equal to 50 μm and less than or equal to 200 μm.

3. The component-incorporated substrate according to claim 1, wherein one of the first wiring patterns is disposed in a position recessed in a horizontal direction than an opening end of the opening is.

4. The component-incorporated substrate according to claim 1, wherein a distance from an opening end of the opening to an end section on an opening side of one of the first wiring patterns is greater than or equal to 2 μm and less than or equal to 100 μm.

* * * * *